(12) United States Patent
Saint-Patrice et al.

(10) Patent No.: US 8,470,184 B2
(45) Date of Patent: Jun. 25, 2013

(54) METHOD FOR MAKING A CAVITY IN THE THICKNESS OF A SUBSTRATE WHICH MAY FORM A SITE FOR RECEIVING A COMPONENT

(75) Inventors: Damien Saint-Patrice, Chabeuil (FR); Sebastien Bolis, Crolles (FR); Fabrice Jacquet, Saint Pierre de Mesage (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 83 days.

(21) Appl. No.: 13/264,170

(22) PCT Filed: Apr. 20, 2010

(86) PCT No.: PCT/EP2010/055185
§ 371 (c)(1),
(2), (4) Date: Oct. 13, 2011

(87) PCT Pub. No.: WO2010/122015
PCT Pub. Date: Oct. 28, 2010

(65) Prior Publication Data
US 2012/0031874 A1    Feb. 9, 2012

(30) Foreign Application Priority Data
Apr. 21, 2009  (FR) .................................. 09 52598

(51) Int. Cl.
*C23F 1/00* (2006.01)
(52) U.S. Cl.
USPC ............................................................ 216/2

(58) Field of Classification Search
USPC ............................................................ 216/2
See application file for complete search history.

(56) References Cited

U.S. PATENT DOCUMENTS

| | | | |
|---|---|---|---|
| 6,350,334 B1 * | 2/2002 | Shigemi et al. ............ | 156/89.12 |
| 2005/0017276 A1 | 1/2005 | Ikushima et al. | |
| 2005/0105184 A1 | 5/2005 | Ma et al. | |
| 2006/0056162 A1 | 3/2006 | Koide | |
| 2007/0190691 A1 | 8/2007 | Humpston et al. | |
| 2009/0206349 A1 | 8/2009 | Yamada et al. | |

FOREIGN PATENT DOCUMENTS

| | | |
|---|---|---|
| EP | 1 635 625 A2 | 3/2006 |
| WO | WO 00/26957 A1 | 5/2000 |
| WO | WO 2008/023824 A1 | 2/2008 |

OTHER PUBLICATIONS

Preliminary Search Report issued Dec. 1, 2009 in FR 0952598 (with English translation of category of cited documents).
U.S. Appl. No. 13/395,169, filed Mar. 9, 2012, Bolis, et al.
U.S. Appl. No. 13/394,641, filed Mar. 7, 2012, Moreau, et al.

* cited by examiner

*Primary Examiner* — Roberts Culbert
(74) *Attorney, Agent, or Firm* — Oblon, Spivak, McClelland, Maier & Neustadt, L.L.P.

(57) ABSTRACT

A method for making a micro-device including at least one receiving site for components, formed in a thickness of a substrate. The method includes: a) making in at least one first substrate adhesively bonded to a second substrate via a discontinuous adhesive bonding interface, at least one first trench around at least one sacrificial block of the first substrate, by etching the first substrate so as to expose the adhesive bonding interface; and b) removing the sacrificial block so as to make at least one first cavity in the first substrate.

15 Claims, 12 Drawing Sheets

METHOD FOR MAKING A CAVITY IN THE THICKNESS OF A SUBSTRATE WHICH MAY FORM A SITE FOR RECEIVING A COMPONENT

TECHNICAL FIELD

The present invention relates to the field of electronic or electromechanical or optical or optoelectronic micro-systems or of chemical or biological measurement micro-systems, and provides a method for making in a substrate one or more cavities which may form sites for receiving one or more electronic, optical components or chemical or biological detection components, or components of the Micro-Electro-Mechanical System (MEMS) type or of the Micro-Opto-Electro-Mechanical system (MOEMS) type, firmly attached to the substrate.

PRIOR ART

In the field of microelectronics and of micro-systems, making cavities in a substrate for example by dry or laser etching, in order to e.g. form sites for receiving components, is known.

The making of such cavities may require the removal of a significant amount of material, which induces significant etching times.

The invention proposes to overcome this problem.

US 2005/0017276 describes a method for manufacturing an electronic device provided with at least one cavity. WO 00/26957 describes a method for manufacturing a substrate in ceramic, with a multiple layer. US 2005/0105184 describes a method for manufacturing membrane structures. EP 1 635 625 describes a method for manufacturing a substrate.

DISCUSSION OF THE INVENTION

The invention relates to a method for manufacturing a micro-device provided with at least one cavity which may form a site for receiving component(s), the cavity being made in the thickness of at least one substrate, the method comprising steps for:

a) making in at least one first substrate assembled to a second substrate via an interface, at least one first trench around at least one sacrificial block of the first substrate, by etching of the first substrate, and so as to expose said interface;

b) removing said sacrificial block so as to make at least one first cavity in the first substrate.

The cavity(ies) formed in the first substrate may be provided for forming sites for receiving components.

The first substrate and the second substrate are assembled via an adhesive bonding interface. The adhesive bonding may be molecular bonding or bonding with provision of material.

The adhesive bonding interface between the first substrate and the second substrate is discontinuous and comprises areas based on at least one adhesive bonding material, and other areas forming an empty space between the first substrate and the second substrate.

The invention therefore uses a discontinuous adhesive bonding interface. This allows easier removal of the sacrificial block since, in this case, the removal does not require any etching.

According to a particular embodiment of the invention, the adhesive bonding interface is a molecular bonding interface which is structured so as to have molecular bonding areas and empty areas without any molecular bonding.

The areas forming an empty space between the first and the second substrate, may have a distribution provided according to that of the sacrificial block and be formed facing the latter.

This may allow easier removal of the sacrificial block.

The discontinuous adhesive bonding interface, between the first substrate and the second substrate, may comprise areas based on at least one first adhesive bonding material, and areas based on at least one second adhesive bonding material, in particular a meltable material, located facing the sacrificial blocks.

The second adhesive bonding material may be provided for achieving provisional or temporary adhesive bonding and may be intended to be removed later on.

According to a possibility of application, the interface between the first substrate and the second substrate may include electrically conducting areas.

Thus, an electric connection between the first substrate and the second substrate may be achieved.

According to one possibility, the method may further comprise: the making of at least one other trench in the second substrate facing said sacrificial block or in the extension of said first cavity.

This other trench may be made around another sacrificial block located facing said sacrificial block. The method may then further comprise the removal of said other sacrificial block so as to form a cavity in the second substrate facing said sacrificial block or in the extension of said first cavity.

The removal of the sacrificial block may be achieved by partial etching of the adhesive bonding interface.

After making the trench, the method may comprise the formation of a protective layer covering the first substrate, and then prior to step b), the removal of the protective layer on the sacrificial block. Thus, the sacrificial block is not protected by this protective layer and may be removed.

According to one possibility, the first substrate and/or the second substrate may be provided with conductive through-elements, in contact with said conducting areas.

In step a), the formation of the trenches may comprise the making of patterns in the first substrate so as to form a test pattern or a visual mark around the sacrificial blocks, these patterns being intended to indicate the center of the cavities. These patterns may also be intended for forming mechanical guiding means. In this case, self-centering of a component intended to be placed in the cavity and being supported on the mechanical guiding means, may be applied.

According to one possibility of application, the first substrate and the second substrate may be formed with different materials.

According to one possibility, the second substrate may be assembled to a third substrate via another interface, the method further comprising:

the making of at least one other trench, crossing the sacrificial block of the first substrate, and extended into the second substrate around at least one sacrificial block of the second substrate as far as the other interface between the second substrate and the third substrate;

the making of at least one trench around at least one sacrificial block of the third substrate, by etching, so as to expose the interface between the second substrate and the third substrate, the step b) further comprising sacrificial blocks of the second substrate and of the third substrate so as to make a cavity crossing the first substrate, the second substrate and the third substrate.

The method may further comprise, after step b), the making of at least one element in the first cavity. This element may be an electronic, RF, optoelectronic component, a chemical or biological detector or a chemical or biological element.

SHORT DESCRIPTION OF THE DRAWINGS

The present invention will be better understood upon reading the description of given exemplary embodiments, purely as an indication and by no means as a limitation, with reference to the appended drawings wherein:

FIGS. 1A-1G illustrate an exemplary method for making a micro-device comprising substrates assembled together via an adhesive bonding layer, and provided with cavities made in the thickness of at least one of the substrates and which may form sites for receiving components;

FIGS. 2A-2D, and 3 illustrate another exemplary method for making a micro-device comprising substrates adhesively bonded together via a discontinuous adhesive bonding interface, and provided with cavities formed in the thickness of at least one of the substrates and which may form sites for receiving components;

Figure 10A:
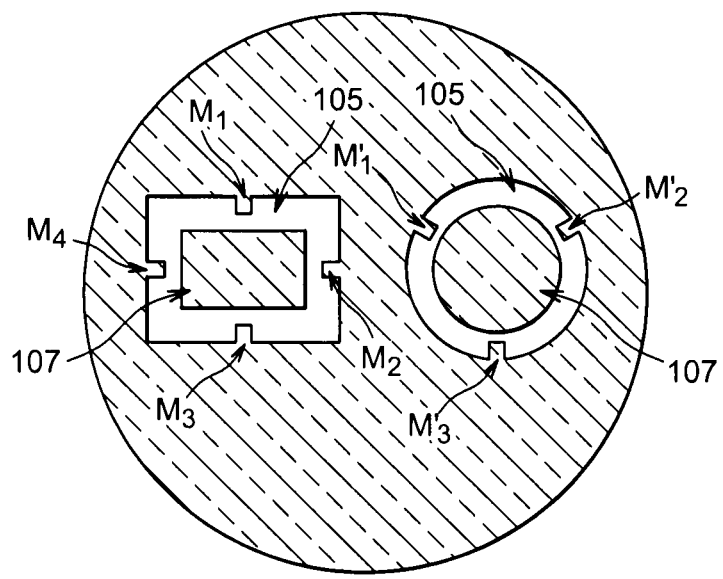
Figure 10B:
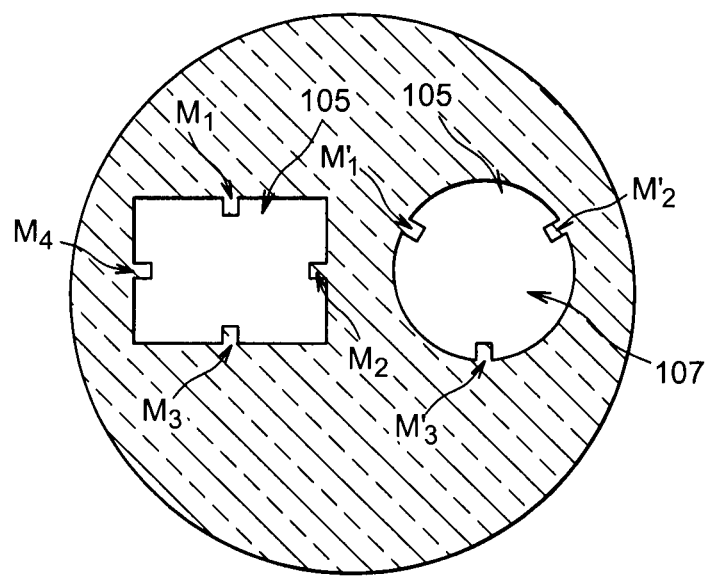
Figure 11:
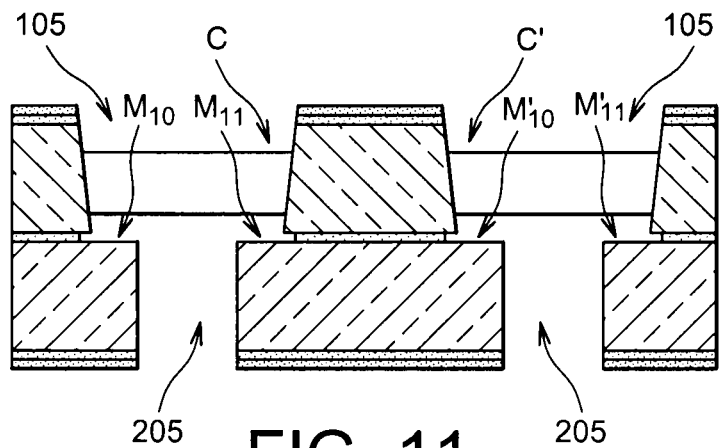
Figure 12:
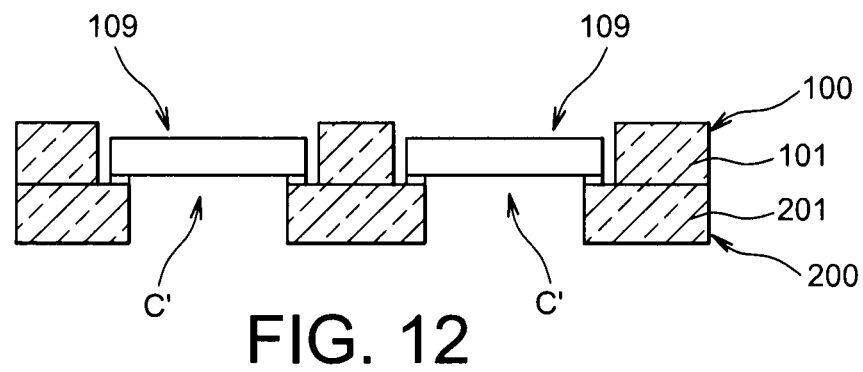
Figure 13:
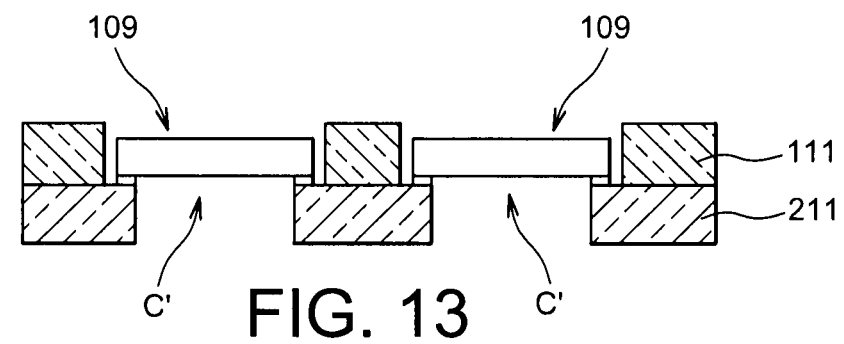

FIGS. 10A and 10B illustrate steps for making sites for receiving components in the thickness of substrates assembled together, during which specific patterns are formed and intended to be used as marks indicating the center of the sites in which the components are intended to be placed or as guiding means for the components so as to guide the components when the latter are placed in the receiving sites;

FIGS. 11 to 13 illustrate different exemplary devices applied according to the invention and formed with assembled substrates in which sites for receiving components have been made.

Identical, similar or equivalent portions of the different figures bear the same numerical references so as to facilitate switching from one figure to the other.

The different portions illustrated in the figures are not necessarily illustrated according to a uniform scale in order to make the figures more legible.

DETAILED DISCUSSION OF PARTICULAR EMBODIMENTS

An exemplary method for making a micro-electronic device according to the invention, will now be given in connection with FIGS. 1A-1G (the device being seen in FIGS. 1A-1B and 1D-1G according to a cross-sectional view A'-A, only the elements located in the sectional plane being illustrated in these figures).

The starting material of this method may be a substrate 100, based on a first material 101, which may be semiconducting, such as silicon or germanium and have a thickness Ea which may be comprised between 10 μm and 1,000 μm.

Next, a second substrate 200 is joined to the substrate 100, for example by an adhesive bonding method such as molecular bonding or bonding with provision of material.

The substrate 200 may also be based on at least one second material 201, which may be a semiconductor such as Si or Ge, and have a thickness Eb which may be comprised between 10 μm and 1,000 μm, for example between 10 and 1000 μm.

According to one possible embodiment, the second substrate 200 may be based on a material 201 different from the material 101 of the substrate 100, for example a semi-conducting material different from the one of the first substrate 100.

Other assemblies of materials may be made.

According to other exemplary embodiments, an assembly of a first glass substrate and of a second glass substrate, or of a glass substrate and of a silicon substrate, or of a ceramic substrate and a glass substrate, or of a glass substrate and of a polymeric substrate, or of a Si substrate and a polymeric substrate, may be achieved.

The bonding of the substrate 100 and 200 may be a so-called "full plate" bonding, wherein, at the bonding interface, is found a continuous adhesive bonding layer 150, in contact between the two substrates 100 and 200.

Figure 1A:
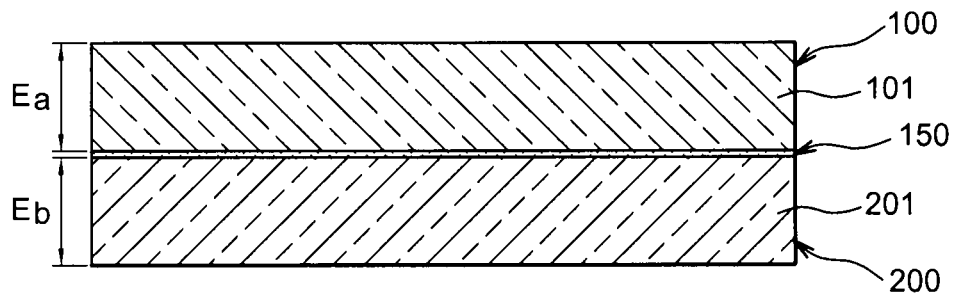

In the case when the two substrates 100 and 200 are based on Si and joined together by adhesive bonding, the bonding interface may for example be a layer 150 of silicon oxide or several stacked layers 150 of silicon oxide, this in order to form silicon/silicon oxide type interfaces and optionally a silicon oxide/silicon oxide interface (FIG. 1A).

Next, a mask 103 may be made on the substrate 100 with view to etching the latter.

The etching mask 103 may for example be based on a resin layer lying on a silicon oxide layer which may be formed by deposition such as by a deposition of the PECVD (plasma-enhanced chemical vapor deposition) type or by thermal oxidation.

Figure 1B:
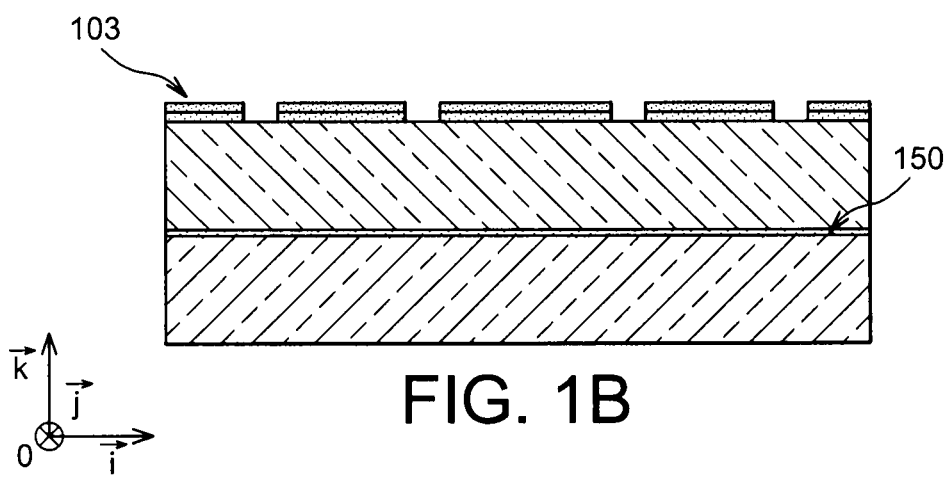

Photolithographic and then etching steps may allow definition of the patterns of the etching mask 103 (FIG. 1B).

Figure 1D:
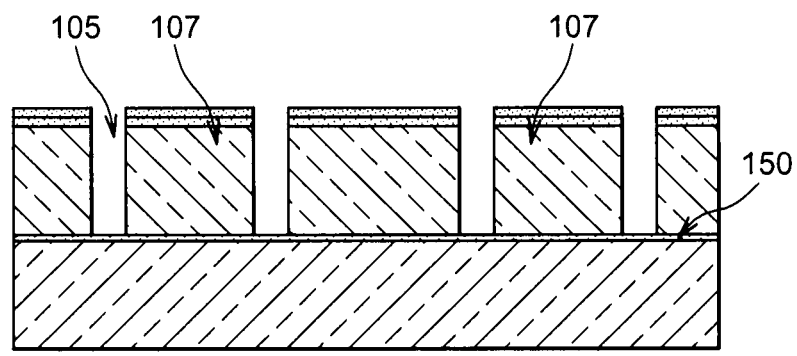
Figure 1C:
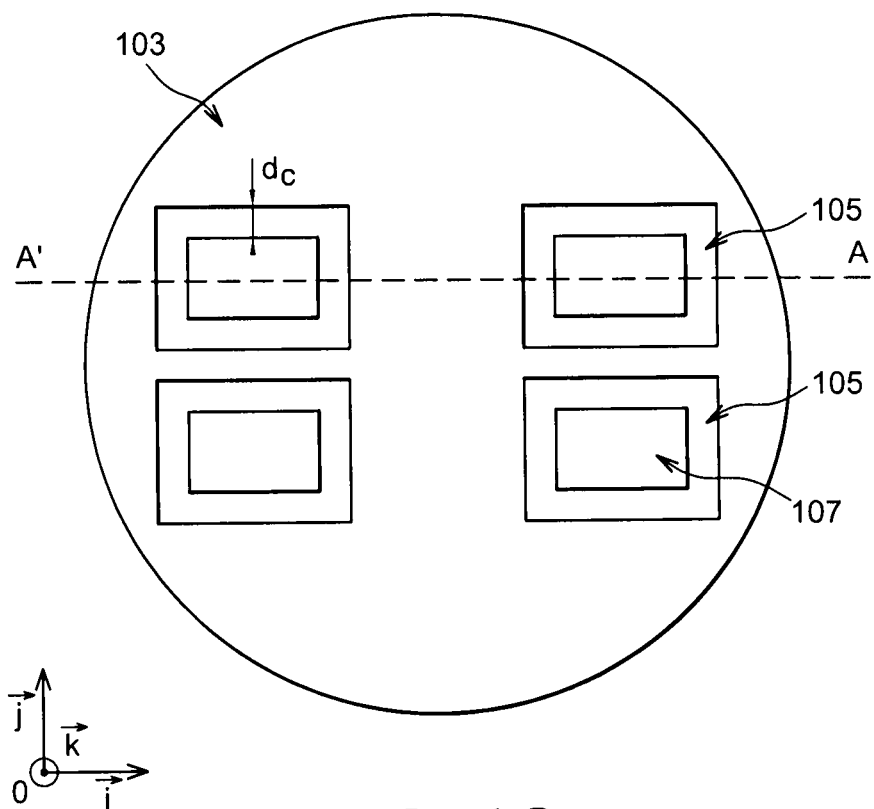

Next, one or more trenches 105 are formed by etching the substrate 100 through the mask in the first substrate 100, surrounding blocks 107 of the latter, which will be called "sacrificial blocks". The trenches 105 each form a contour around a sacrificial block 107 of the substrate 100, which is cut out and intended to be removed later on (FIG. 1C).

The trenches 105 are provided so as to expose the adhesive bonding layer 150. The trenches 105 may have a thickness at least equal to Ea and open out onto the bonding interface between the substrates, or optionally cross this interface. The trenches 105 may have a critical dimension dc of the order of 10 μm for example when they are made by DRIE etching of a substrate having a thickness Ea, for example of the order of 720 μm. By "critical dimension", is meant the smallest dimension of a pattern made in a layer or a stack of layers except for its thickness (the critical dimension being measured in these figures in a direction parallel to that of the plane $[O; \vec{i}; \vec{j}]$ of the orthogonal reference system $[O; \vec{i}; \vec{j}; \vec{k}]$). According to one possibility (not shown in FIG. 1C), the trenches 105 may optionally open out into the second substrate 200.

The etching of the trenches 105 may be carried out with a laser etching method or by deep plasma etching. In one case for example, when the trenches are made by etching, such as deep reactive ion etching also called DRIE (for Deep Reactive Ion Etching), significant selectivity may be obtained relatively to the silicon oxide of the bonding layer 150, so that the etching may stop on the bonding interface when the latter is based on silicon oxide (FIG. 1D).

Next, removal of the sacrificial blocks 107 is carried out.

The removal of the sacrificial blocks 107 may be achieved by etching the layer 150 or adhesive bonding layers 150 at the interface between the substrate 100 and 200 through the trenches 105. Thus, the material of the bonding layer 150 under the sacrificial blocks 107 is removed.

In the case when the bonding layer 150 or the adhesive bonding layers 150 are based on $SiO_2$, etching for example with HF may be carried out.

Figure 1E:
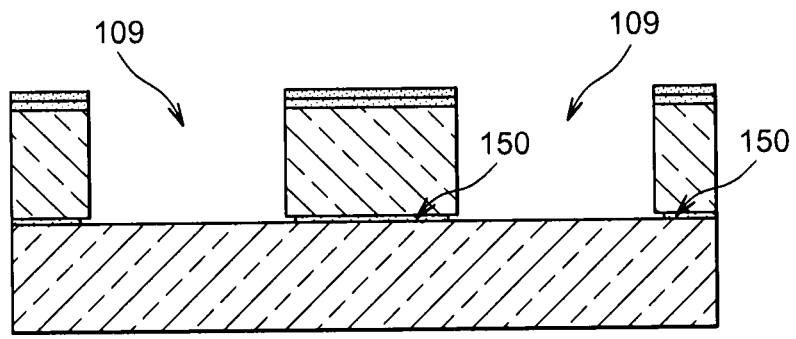

By removing the sacrificial blocks 107 it is possible to form cavities 109 in the first substrate 100. These cavities may form sites for receiving one or more components which may be electronic, and/or optical, and/or opto-electronic, and/or electromechanical, and/or for chemical or biological detection (FIG. 1E).

According to one possibility (not shown in FIGS. 1E and 1F), secondary trenches may be formed in the sacrificial blocks 107, in order to subsequently facilitate etching of the adhesive bonding interface 150 and/or avoid over-etching.

In the case of an optical application, and in particular when the cavities 109 cross the first substrate 100, the optical components formed in the cavities 109 may for example be lenses, or filters such as for example IR filters.

In the case of an electronic application, the electronic components formed in the cavities may for example be integrated circuits, or memories, or microprocessors, or converters.

According to other possibilities, the components may be MEMSes or for example getters. According to another possibility, the structure made may be intended to form a cap of a MEMS component.

Figure 1F:
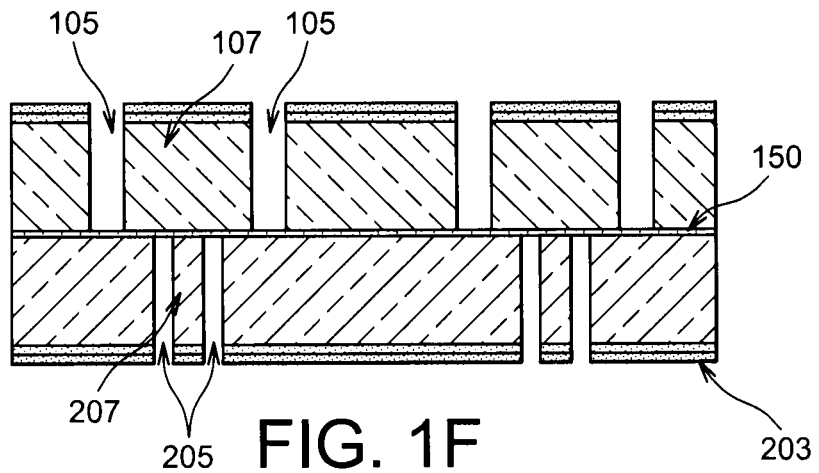

According to one alternative, the method may comprise the formation of other trenches 205 in the second substrate 200, located between the trenches 105. These other trenches 205 may be made prior to the removal of the sacrificial blocks 107, facing the latter (FIG. 1F).

The other trenches 205 may also be made around sacrificial blocks 207 of the second substrate 200, so as to form contours around these blocks 207. The trenches 205 may be formed through an etching mask 203, deposited on the second substrate 200 and which may be similar to the mask 103, made with view to forming the trenches 205.

The other trenches 205 may optionally be formed facing the trenches 105 or in the extension of the latter.

The trenches 205 are made so that a small volume of material of the second substrate 200 is removed around the sacrificial blocks 207. The trenches 205 may have a thickness equal to Eb, and a critical dimension dc which may for example be of the order of several micrometers.

Figure 1G:
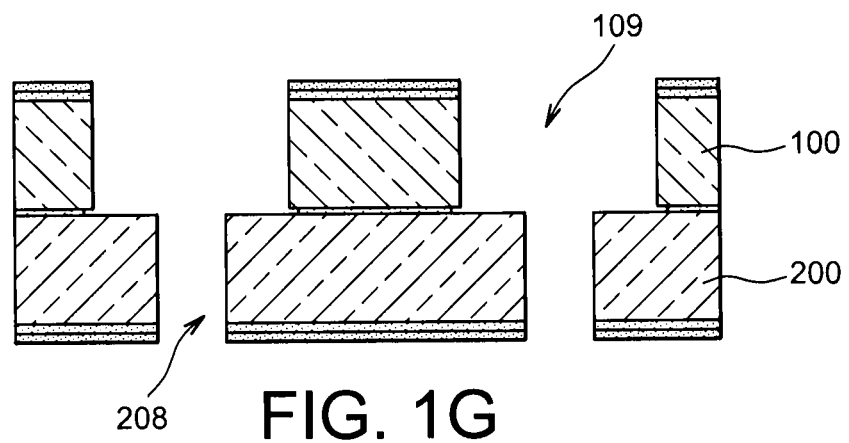

The formation of the other trenches 205, and a removal of the sacrificial blocks 207 of the second substrate 200 allow creation of apertures 209 in the second substrate 200, in the extension of the cavities 109 (FIG. 1G).

Also, according to one possibility (not shown), other secondary trenches may be formed in the sacrificial blocks 207 of the second substrate 200, in order to subsequently facilitate etching of the adhesive bonding interface 150 and/or avoid over-etching.

Removal of the sacrificial blocks 207 may, like that of the sacrificial blocks 107, be achieved by etching the adhesive bonding layer 150. In the case when the adhesive bonding layer 150 is based on $SiO_2$, etching may be carried out for example with HF.

According to another possibility of application, removal of the sacrificial blocks 107 and 207 may be achieved simultaneously, by etching of the adhesive bonding layer 150 through the trenches 209 and/or trenches 109.

According to an alternative exemplary embodiment which has just been given, the substrates 100 and 200 may be joined by adhesive bonding, by making this time a discontinuous adhesive bonding interface between the first substrate 100 and the second substrate 200. FIGS. 2A-2D and 3 illustrate such an alternative.

The discontinuous interface may be achieved so that certain areas 250b of this interface between the two substrates 100 and 200 do not include any adhesive bonding material and form an empty space between the substrates 100 and 200, while other areas 250a based on a given adhesive bonding material, ensure the adhesive bonding between the substrates 100 and 200.

Figure 2A:
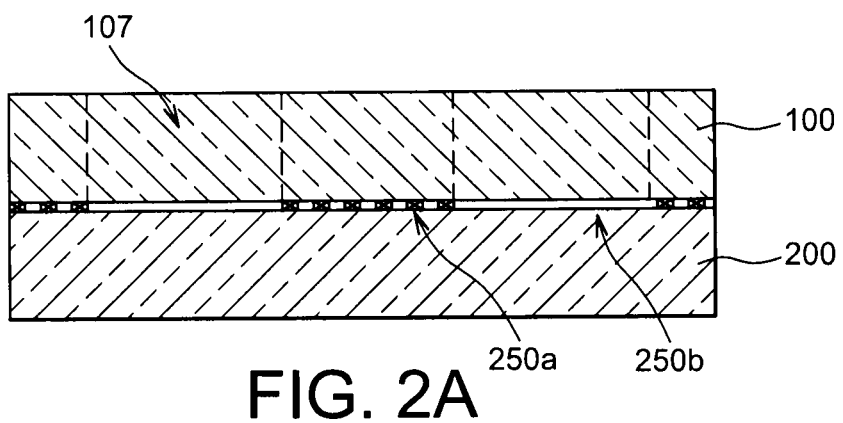

The empty areas 250b between the two substrates 100 and 200 may be positioned according to the distribution of said "sacrificial blocks" 107 of the first substrate 100, which are intended to be suppressed. The areas 250b may be placed facing said "sacrificial" blocks 107 of the first substrate 100, so that the sacrificial blocks 107 of the first substrate 100 and the second substrate 200 are separated by empty areas 250b (FIG. 2A).

According to one possibility of application, the bonding areas 250a may be based on an electrically conducting material such as a metal material, which may give the possibility of ensuring electrical continuity between the substrates 100 and 200. The conducting material may for example be a metal alloy such as AuSn, or be based on copper, or for example formed with superposed copper layers.

The adhesively bonded substrates 100 and 200 may be of different natures, optionally with respective expansion coefficients far from each other.

Next, steps for making an etching mask 103, and then trenches by etching the first substrate 100 through the etching mask 103, may be carried out, for example in the way described earlier in connection with FIGS. 1A-1D.

The trenches 105 are made so as to expose the adhesive bonding interface by etching and may optionally be extended as far as into the second substrate 200, beyond the adhesive bonding interface, for example so as to cross a controlled thickness Ei of the second substrate 200.

The trenches 105 may be made facing the areas 250b, or so as to end up with the areas 250b, or to cross the areas 250b, which, between the two substrates 100 and 200, do not include any adhesive bonding material.

Figure 2B:
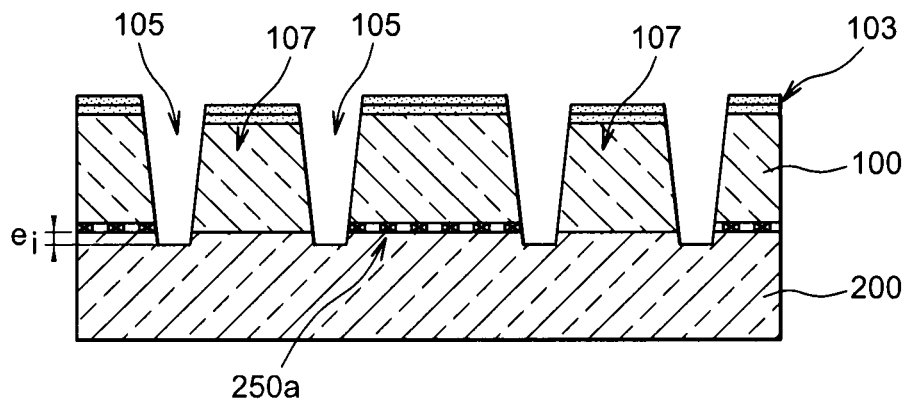

When the trenches 105 are formed so as to surround the sacrificial blocks 107 of the substrate 100 which are not maintained adhesively bonded to the substrate 200 via bonding areas 250a, these sacrificial blocks 107 are not mechanically held via an adhesive bonding material. These sacrificial blocks 107 may thus be detached and removed more easily (FIG. 2B).

According to one alternative (not shown), the layout of the areas 250a and 250b of the adhesive bonding interface and that of the trenches 105, is provided so that the sacrificial blocks 107 surrounded by the trenches 105 are maintained adhesively bonded to the substrate 200 through adhesive bonding areas 250a located in proximity to the trenches 105, while an empty space is provided between the center of the sacrificial blocks 107 and the substrate 200. Thus, the blocks 107 may be held adhesively bonded to the substrate 200, while ensuring that the adhesion to the substrate 200 is sufficiently low so that they may be easily removed later on.

According to another alternative (FIG. 3), the discontinuous adhesive bonding interface may have been made so that certain areas 250b of the interface between the two substrates 100 and 200 do not include any adhesive bonding material and form an empty space between the substrates 100 and 200, while areas 250a and 250c of different adhesive bonding materials are provided.

Areas 250a of a first adhesive bonding material and areas 250c based on a second adhesive bonding material, ensure the adhesive bonding between the substrates 100 and 200. The areas 250a, 250c between the two substrates 100 and 200 are distributed according to that of the sacrificial blocks 107 of the substrate 100 intended to be suppressed.

The first material of the areas 250a may for example be based on a conducting material. The sacrificial blocks 107 may be positioned facing the areas 250c based on the second adhesive bonding material. The second adhesive bonding material may advantageously be a material which may be removed subsequently from the substrates or detached from the substrates, for example by means of a solvent or by heating. The second adhesive bonding material may for example be an adhesive or a sealing resin.

Thus, the second adhesive bonding material may be provided for carrying out temporary adhesive bonding and may be intended to be suppressed. The second adhesive bonding material may be selected as a material which may be selectively removed with respect to the first material or more easily to remove than the first material.

In the case when the second adhesive bonding material is a polymer of the resin or adhesive type, this material may be dissolved by means of at least one solvent for example based on acetone, fuming nitric acid, or a plasma for example based on $O_2+SF_6$.

The layout of the areas 250c of the adhesive bonding interface and that of the trenches 105 is provided so that the sacrificial blocks 107 surrounded by the trenches 105, are maintained bonded to the substrate 200 through the areas 250c based on the meltable material; an empty space may be provided between the sacrificial blocks 107 and the substrate 100, this in order to provisionally maintain the blocks 107 bonded to the substrate 200, while allowing them to be removed easily later on.

Thus, a specific adhesive bonding interface was formed facing the sacrificial blocks, this interface being different from that provided for adhesively bonding the other areas of the substrates 100 and 200. This specific adhesive bonding interface may give the possibility of maintaining provisionally bonded the sacrificial blocks 107. The specific adhesive bonding interface may be provided so as to be suppressed or to have a sufficiently low mechanical strength so as to allow subsequent separation of the sacrificial blocks 107 from the substrate 200.

Figure 2C:
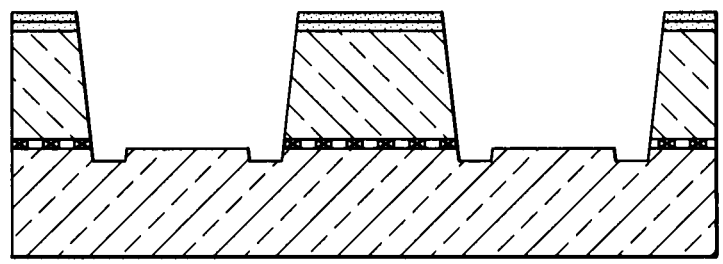
Figure 2D:
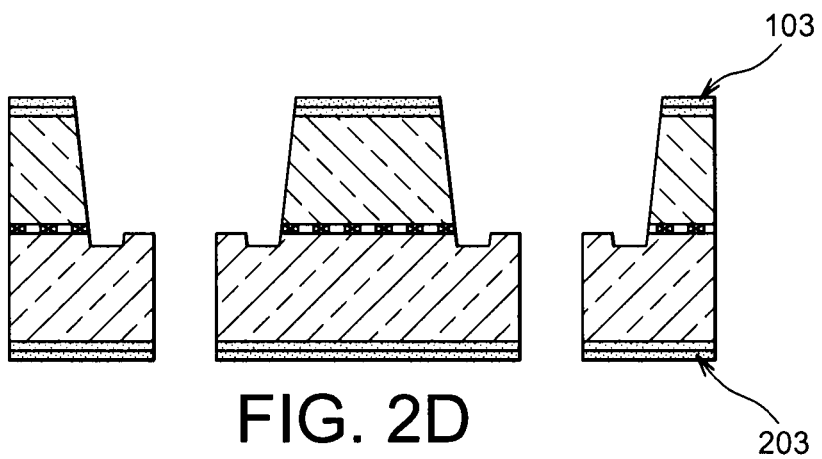
Figure 3:
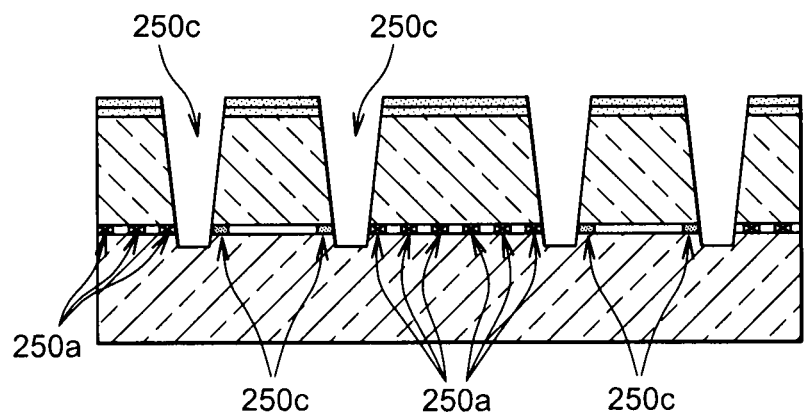

After etching the trenches 105, the sacrificial blocks 107 inside the latter may be removed (FIGS. 2C and 2D).

The removal of the sacrificial blocks 107 may be carried out in a similar way to the one described earlier in connection with FIG. 1E, in which etching is carried out through the trenches (FIG. 2C).

The removal of the sacrificial blocks 107 may be carried out in a way similar to the one described earlier in connection with FIG. 1G, by forming beforehand the trenches 205 in the second substrate 200, and then by carrying out etching through the trenches 105 and/or the trenches 205 (FIG. 2D).

According to a particular embodiment not shown, the adhesive bonding interface between the substrates 100 and 200 is a molecular bonding interface. It is structured so as to include molecular bonding areas and empty areas, without molecular bonding.

Figure 4A:
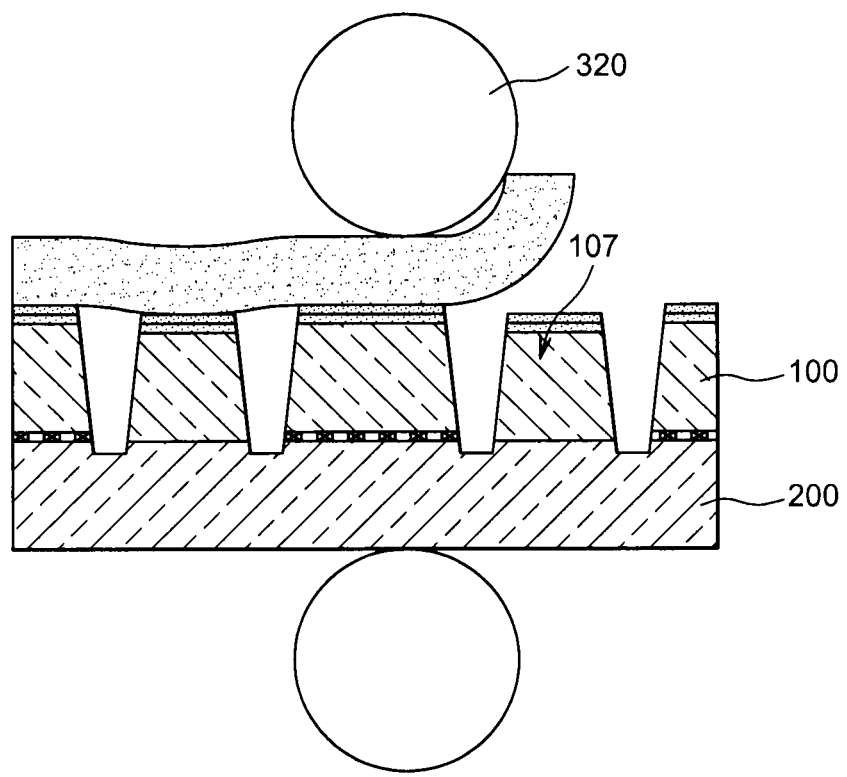
FIGS. 4A-4B illustrate an exemplary method for removing sacrificial blocks, which may be applied during a method according to the invention.
Figure 4B:
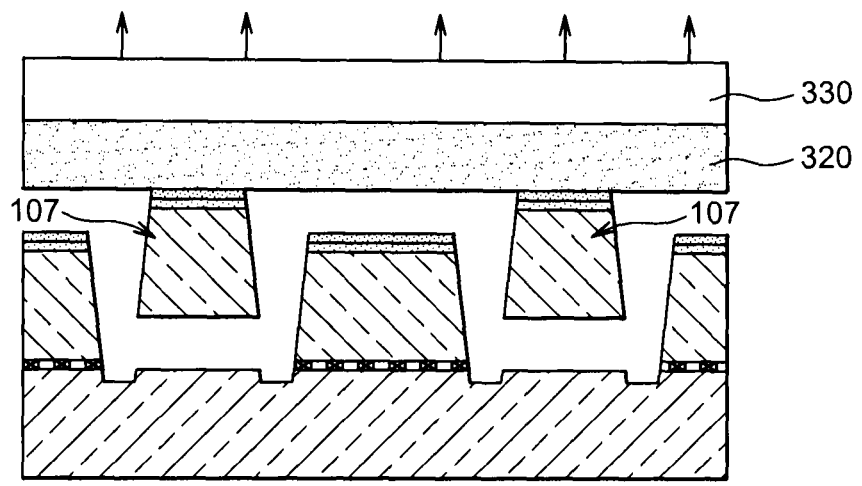

In FIGS. 4A-4B, another exemplary method for removing the sacrificial blocks 107 is given.

It is possible to remove the sacrificial blocks by depositing an adhesive film 310 on the substrate 100, for example by using a lamination piece of equipment provided with rollers 320 allowing the adhesive film 310 to be positioned on the substrate 100 (FIG. 4A).

Next, by means of a support 330 put into contact with the film 320 and forming a handle, the adhesive film is removed so as to recover the sacrificial blocks 107 (FIG. 4B).

Another exemplary method for removing the sacrificial blocks will now be given in connection with FIGS. 5A-5D.

According to this other example, the sacrificial blocks are removed by etching the material 101 on the basis of which the latter are formed.

Figure 5A:
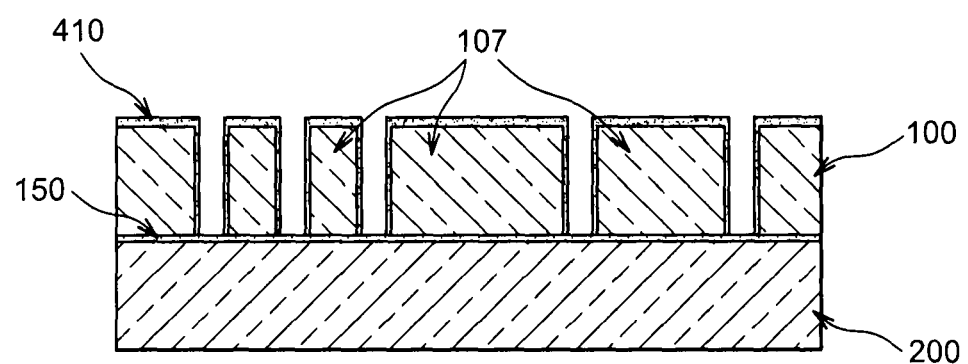
FIGS. 5A-5D illustrate an alternative method according to the invention.

For this, once the trenches 105 have been made, a protective layer 410 is formed, covering the substrate 100, the walls and the bottom of the trenches (FIG. 5A). The protective layer 410 may for example be a layer based on $SiO_2$, with a thickness of the order of 1 µm. This $SiO_2$ layer may for example be made after having removed the etching mask 103, by thermal oxidation of the substrate 100 during high temperature annealing. The thickness of the protective layer 410 may be provided so as to be less than that of the adhesive bonding layer 150 located at the interface between both substrates 100 and 200, in particular in the case when the adhesive bonding layer 150 and the protective layer are formed with a same material such as $SiO_2$.

Figure 5B:
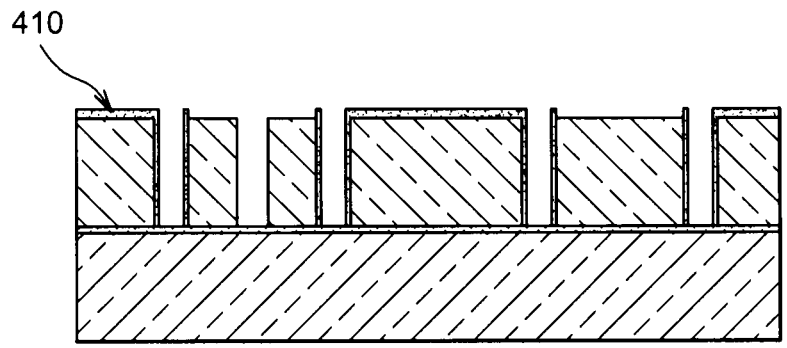

The protective layer 410 is then removed locally in an area located above the sacrificial blocks 107 (FIG. 5B).

Figure 5C:
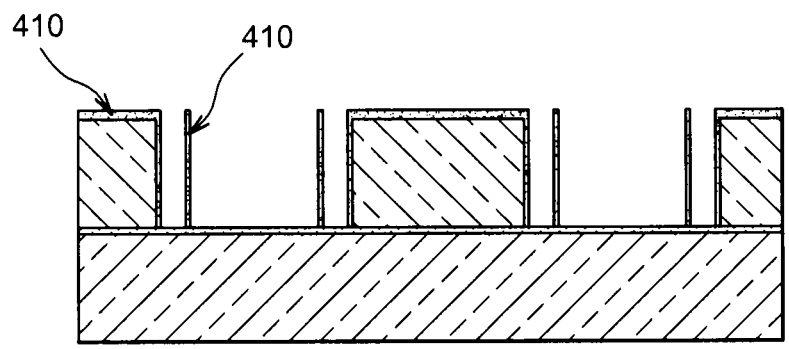
Figure 5D:
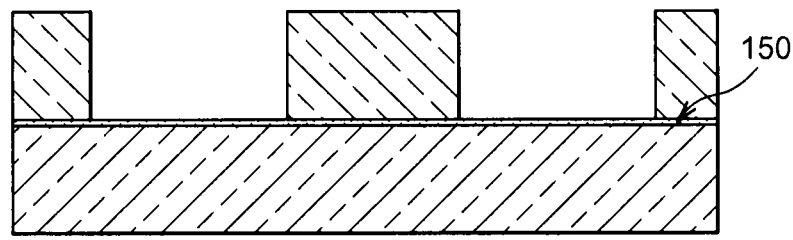

Then, the sacrificial blocks 107 are etched. When the substrate 100 is based on Si, this etching may for example be achieved with KOH or TMAH (FIG. 5C).

Next, the protective layer 410 is removed. This removal may for example be achieved by etching with an HF solution.

According to an alternative of either one of the exemplary embodiments which have just been given, conducting elements commonly called vias may be provided in the first substrate 100 and/or the second substrate 200.

Figure 6:
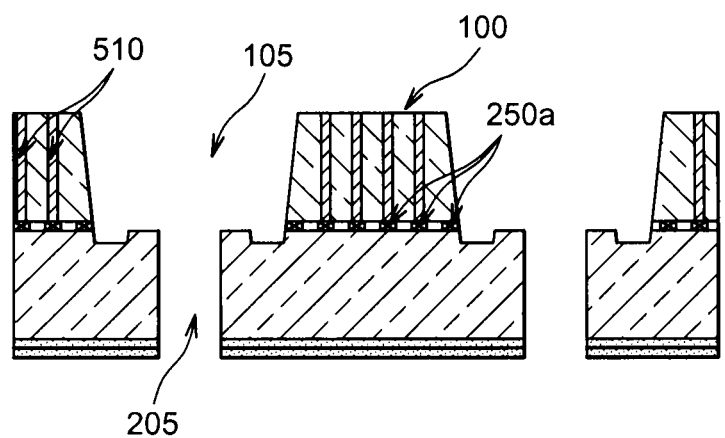
FIG. 6 illustrates an exemplary micro-device applied by means of a method according to the invention comprising substrates assembled together, and provided with sites for receiving components, at least one of the substrates being provided with conducting vias crossing its thickness.

In FIG. 6, such an alternative is illustrated. The substrate 100 is provided with conducting elements 510 crossing the thickness of the latter and which are in contact with conducting areas 250a of the bonding interface, when the latter is for example formed with a plurality of separated metal areas.

The conducting through-elements 510 may have been formed beforehand, so that the starting material of the method is a substrate 100 provided with conducting through-elements 510, or after having carried out a succession of method steps as described earlier.

Such an arrangement may be used for example for applications to 3D imaging devices provided with several substrates interconnected via inter-substrate vias.

Figure 7:
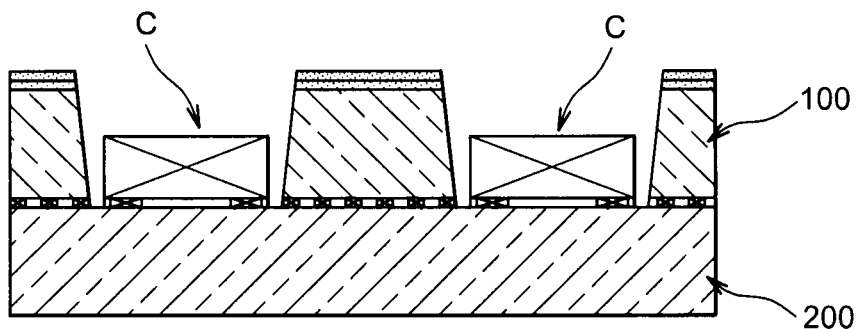
FIG. 7 illustrates an exemplary micro-device applied by means of a method according to the invention, comprising substrates assembled together, and provided with components housed in receiving sites in the thickness of at least one of the substrates.

After the cavities 109 have been made in the first substrate 100, components C may be placed in these cavities 109. These components C may for example be electronic chips or optical components, or MEMSes (MEMSes for electro-mechanical microsystems) (FIG. 7).

Figure 8A:
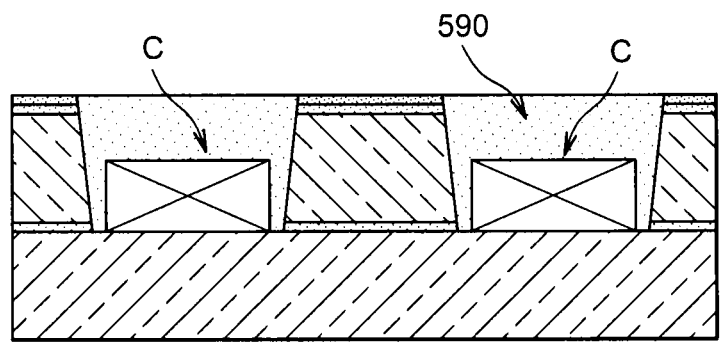
FIGS. 8A and 8B illustrate an exemplary embodiment of a micro-device applied according to the invention, wherein components are housed in cavities forming receiving sites in the thickness of at least one substrate, the components being coated in a protective material.

A coating material 550 may then be positioned in the cavities 109 in order to protect the components C located in the latter (FIG. 8A). The coating material may for example be an encapsulation resin such as an epoxy resin and commonly called a "glop-top".

Figure 8B:
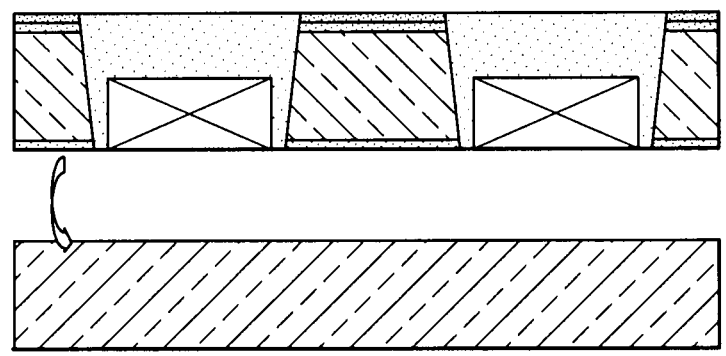

A step for separating the 2 substrates 100 and 200 may then optionally be carried out (FIG. 8B), for example by etching the adhesive bonding layer or by using a temporary adhesive bonding interface.

Figure 9A:
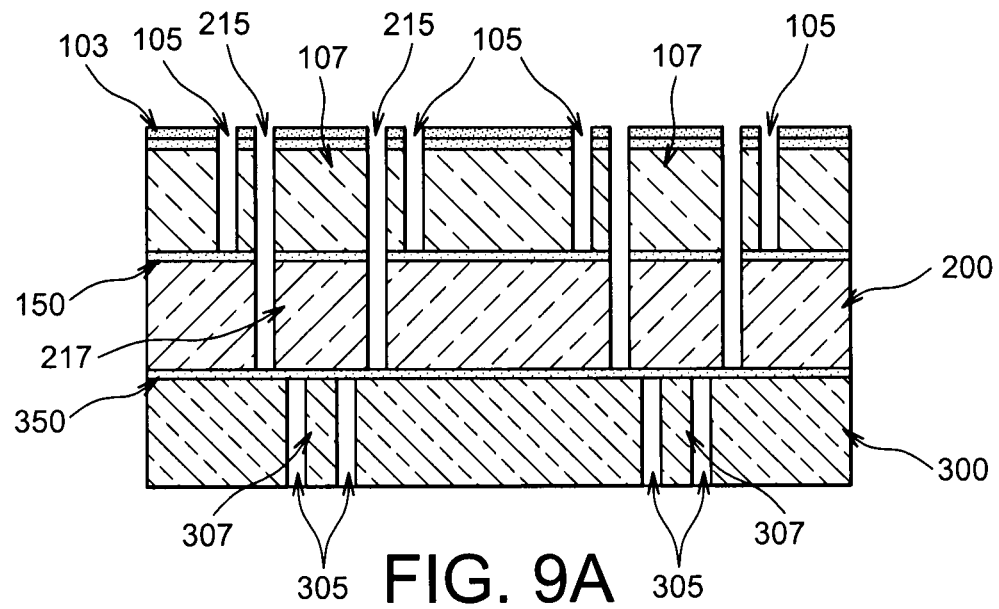
FIGS. 9A and 9B illustrate an exemplary embodiment of a micro-device applied according to the invention, provided with receiving sites formed in the thickness of three substrates adhesively bonded together.
Figure 9B:
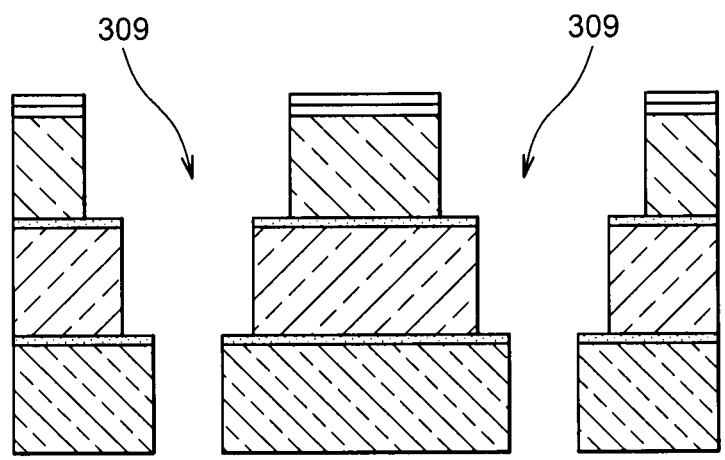

A method according to the invention may be applied on more than two substrates. In FIGS. 9A-9B, an exemplary method is illustrated, in which sites for receiving components are formed in three adhesively bonded substrates 100, 200, 300.

To a substrate 100, a second substrate 200 is joined for example by an adhesive bonding method such as molecular bonding or bonding with provision of material.

The bonding of the substrates 100 and 200 may be achieved with an adhesive bonding layer 150 between the two substrates 100 and 200, for example a layer formed with one or several thicknesses of $SiO_2$ when the substrates are based on Si.

To the substrate 200, a third substrate 300 is joined, for example by an adhesive bonding method such as a molecular bonding or bonding with provision of material.

The bonding of the substrates 200 and 300 may be achieved with an adhesive bonding layer 350 between, for example a layer formed with one or several thicknesses of $SiO_2$ when the substrates 200 and 300 are based on Si.

Next, an etching mask 103 may be made on the substrate 100, with view to etching the latter.

Next, one or more trenches 105 are formed by etching through the mask into the first substrate 100, surrounding the sacrificial blocks 107, as far as the layer 150 at the adhesive bonding interface between the substrates 100 and 200.

The trenches 105 each form a contour around a sacrificial block 107 of the substrate 100, which is cut out and intended to be removed later on.

Next, one or more other trenches 215 may be formed by etching through the mask 103 into the first substrate 100, so as to cross the sacrificial blocks 107.

This etching may be achieved as far as the layer 350 at the bonding interface between the substrates 200 and 300.

The trenches 215 may each form a contour around a sacrificial block 217 of the second substrate 200, which is cut out and intended to be removed later on.

Next, on the other side of the assembly of substrates 100-200-300, it is possible to form one or more other trenches 305 in the third substrate 300, facing the sacrificial blocks 107, 217 located in the first substrate 100 and in the second substrate 200 and so as to expose the adhesive bonding layer 350.

This etching may be achieved as far as the layer 350 at the adhesive bonding interface between the substrates 200 and 300.

The trenches 305 may each form a contour around a sacrificial block 307 of the third substrate 300, which is cut out and intended to be removed later on (FIG. 9A).

Next, removal of the sacrificial blocks 107, 207, 307 is carried out. The removal may be carried out for example by isotropic etching of a portion of the adhesive bonding layers 150 and 350, in order to allow detachment of the sacrificial blocks 107, 217, 307.

Once the sacrificial blocks have been removed, cavities 309 crossing the three substrates 100, 200, 300 are thereby formed. These cavities 309 may have walls forming a staircase profile.

The cavities 309 may be used as sites for receiving components, for example optical components (FIG. 9B).

According to one possibility of application of either one of the methods described earlier, when trenches 105 are made so as to cut out the sacrificial blocks 107 in the first substrate 100, provision may be made for keeping on the walls of the trenches 105, patterns $M_1$, $M_2$, $M_3$, $M_4$, and $M'_1$, $M'_2$, $M'_3$ based on the material 101 of the first substrate, laid out so as to form visual indicators or test patterns for example indicating the center of the sacrificial blocks 107 when they have not been removed (FIG. 10A). The patterns $M_1$, $M_2$, $M_3$, $M_4$, and $M'_1$, $M'_2$, $M'_3$ based on the material 101 of the first substrate, may also be laid out so as to form guiding means for example indicating the center of the sacrificial blocks 107 when they have not been removed (FIG. 10A).

The patterns $M_1$, $M_2$, $M_3$, $M_4$, and $M'_1$, $M'_2$, $M'_3$ based on the material 101 may indicate the center of the cavities forming sites for receiving components when the sacrificial blocks have been removed (FIG. 10B) and also optionally guiding means for giving the possibility of achieving accurate positioning or self-centering of the components placed in the cavities.

It is also possible to make structures or patterns $M_{10}$, $M_{11}$, and $M'_{10}$, $M'_{11}$ forming visual indicators or centering test patterns, upon making trenches 205 in the second substrate 200 opening out onto the trenches 105 made in the first substrate 100. Once the sacrificial blocks have been removed, the space left in the substrate 100 and 200 by these blocks, as well as the trenches 105, 205, form cavities 109 crossing both substrates 100, 200 and forming sites for receiving components C, C' for example optical components. The centering test patterns $M_{10}$, $M_{11}$, and $M'_{10}$, $M'_{11}$ may allow easier positioning of the components C, C' when the latter are placed in the cavities (FIG. 11).

An exemplary device applied by means of a method according to the invention is given in FIG. 12.

This device includes a first substrate 100 based on a first material 101 and adhesively bonded to a second substrate 200, based on the same material as the first substrate 101. Cavities 109 are formed in the first substrate 100, and the second substrate 200 and form sites for receiving components C', for example optical components such as filters or lenses.

Another exemplary device applied by means of a method according to the invention is given in FIG. 13 and differs from the previous one, in that the first substrate is based on a material 111 different from that of the second substrate 200.

A method according to the invention as described in either one of the examples given earlier, gives the possibility of reducing the overall time for the etchings required for making the receiving sites.

A method according to the invention also gives the possibility of making structures with significant aperture levels and sites for receiving components, the positioning accuracy error being less than 5 μm.

The invention claimed is:

1. A method for making a micro device including at least one cavity, formed in a thickness of the substrate, the method comprising:
   a) making in at least one first substrate assembled to a second substrate via an interface, at least one first trench around at least one sacrificial block of the first substrate, by etching the first substrate so as to expose the interface; and
   b) removing the sacrificial block so as to make at least one first cavity in the first substrate,
   wherein the first substrate and the second substrate are adhesively bonded, the interface being an adhesive bonding interface, and wherein the adhesive bonding interface between the first substrate and the second substrate is discontinuous and comprises areas based on at least one adhesive bonding material and areas forming an empty space between the first and the second substrate.

2. The method according to claim 1, wherein the first substrate and the second substrate are formed with different materials.

3. The method according to claim 1, wherein the adhesive bonding interface is a molecular bonding interface that is structured so as to have molecular bonding areas and empty areas, without molecular bonding.

4. The method according to claim 1, wherein the sacrificial blocks are located facing areas of the interface forming an empty space between the first substrate and the second substrate.

5. The method according to claim 1, wherein the adhesive bonding interface between the first substrate and the second substrate is discontinuous and comprises areas based on at least one first adhesive bonding material, and areas based on at least one second adhesive bonding material, located facing the sacrificial blocks.

6. The method according to claim 1, wherein the interface between the first substrate and the second substrate includes electrically conducting areas.

7. The method according to claim 1, further comprising:
making at least one other trench in the second substrate facing the sacrificial block or in an extension of the first cavity.

8. The method according to claim 7, wherein the other trench is made around another sacrificial block located facing the sacrificial block,
the method further comprising removing the other sacrificial block so as to form a cavity in the second substrate facing the sacrificial block or in the extension of the first cavity.

9. The method according to claim 1, the b) removing the sacrificial block being achieved by partial etching of the adhesive bonding interface.

10. The method according to claim 1, further comprising, after making the trench, forming a protective layer covering the first substrate, and then prior to the removing b), removing the protective layer on the sacrificial block.

11. The method according to claim 1, wherein the adhesive bonding interface includes electrically conducting areas, the first substrate and/or the second substrate including conducting through elements, in contact with the conducting areas.

12. The method according to claim 1, wherein, in the making a), formation of the trenches comprises making patterns in the first substrate forming one or more visual marks around the sacrificial blocks and configured to indicate a center of the cavities and/or guiding means.

13. The method according to claim 1, wherein the second substrate is assembled to a third substrate via another interface, the method further comprising:
making at least one other trench crossing the sacrificial block of the first substrate and extended into the second substrate around at least one sacrificial block of the second substrate as far as the other interface between the second substrate and the third substrate, and
making at least one trench around at least one sacrificial block of the third substrate, by etching so as to expose the other interface,
the removing b) further comprising sacrificial blocks of the second substrate and of the third substrate so as to make a cavity crossing the first substrate, the second substrate, and the third substrate.

14. The method according to claim 1, further comprising, after the removing b), making at least one element in the first cavity or making an electronic, RF, opto-electronic component, or a component for chemical or biological detection in the first cavity.

15. The method according to claim 1, further comprising, after the removing b), separating the first substrate and the second substrate.

* * * * *